Sept. 2, 1969 R. EDWARDS ET AL 3,464,868
METHOD OF ENHANCING TRANSISTOR SWITCHING CHARACTERISTICS
Filed Jan. 13, 1967
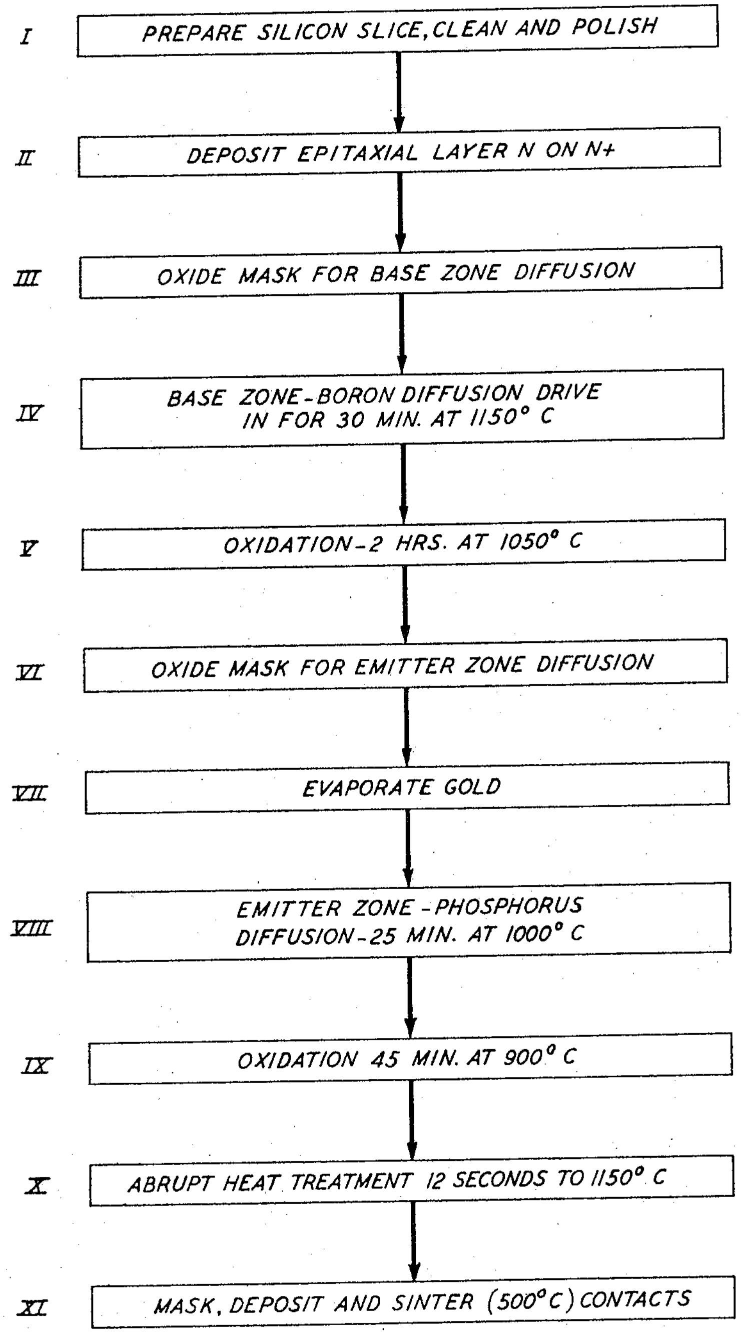
INVENTORS: R. EDWARDS
P.P. PERRON, JR.
BY H.W. Lockhart
ATTORNEY 3,464,868

METHOD OF ENHANCING TRANSISTOR SWITCHING CHARACTERISTICS

Roger Edwards, Gillette, N.J., and Paul P. Perron, Jr., Hanover Township, Lehigh County, Pa., assignors to Bell Telephone Laboratories, Inc., Murray Hill and Berkeley Heights, N.J., a corporation of New York Filed Jan. 13, 1967, Ser. No. 609,210
Int. Cl. H01l 7/44
U.S. Cl. 148—186 3 Claims

ABSTRACT OF THE DISCLOSURE

Silicon transistors containing both conductivity type zones produced by diffusion, and diffused gold to control minority carrier lifetime, are subjected to a very brief, high temperature, terminal heat treatment. Typically this heat treatment is at a temperature of from 1000 to 1100 degrees centigrade for a period of up to about 30 seconds. This treatment distributes previously introduced gold to more effective locations within the device without deleteriously affecting diffused PN junctions. Subsequent processing involves only lower temperatures, less than about 600 degrees centigrade.

BACKGROUND OF THE INVENTION

The invention relates to silicon switching transistors in which the speed at which the change from the "on" to the "off" state is, to a considerable extent, a function of the minority carrier lifetime in certain portions of the transistor body. In particular, it is desirable to have a low minority carrier lifetime in portions of the collector zone in order to facilitate removal of the stored charge therein when the conductive state of the device is changed.

The use of gold dispersed within a silicon body to reduce minority carrier lifetime therein is well known. In particular it is known also to provide gold in particular portions of the device and at particular concentration levels. Techniques for introducing gold to achieve desired concentration levels are likewise known. However, it appears that, at whatever stage of fabrication the gold is introduced, conventional prior art processing does not place it in optimum locations.

SUMMARY OF INVENTION

In accordance with the invention the requisite amount of gold is introduced from the reverse side of the semiconductor body at a convenient point in the processing by a high temperature heat treatment. Advantageously, such introduction can be done at the same time as one of the significant impurity diffusion steps.

Then, subsequent to the high temperature fabrication steps of diffusion and oxidation, the semiconductor material is subjected to a brief, less than about one-half minute, high temperature heat treatment. This step effects a redistribution of the gold from locations at which it has tended to accumulate as a consequence of heat treatments during and subsequent to its initial diffusion. Accordinglv the fabrication of the semiconductor device subsequent to this abrupt of "spike" heat treatment involves only heating operations for relatively short times at below about 600 degrees centigrade which have substantially no effect on the dispersed gold.

Thus, a feature in accordance with the invention is the addition of an abrupt heat treatment which results in a considerable improvement in the switching response of the device without substantially altering the basic fabrication procedure and with only minor changes in the other impurity distributions.

A more complete understanding of the invention may be had from the following more detailed description taken in conjunction with the drawing which is a flow chart of the steps in a typical transistor fabrication process including this invention.

DESCRIPTION OF PREFERRED EMBODIMENT

The invention is hereinafter described as applied to the fabrication of planar epitaxial silicon transistors, using, except for the heat treatment step in accordance with this invention, standard, well-known procedures.

In particular, the fabrication begins, as indicated in Block I of the drawing, with preparation of a single crystal silicon slice of from one-half to one and one-quarter inch diameter and about six mils thick. Assuming that the transistor being fabricated is of NPN configuration the slice will be of N type conductivity having relatively low resistivity, typically .005 ohm centimeter.

The next step (Block II) involves the formation of an epitaxial film of relatively high resistivity N type silicon on one polished surface of the silicon slice. In a specific embodiment, this film is about five microns thick and has a resistivity of about 0.2 ohm centimeter. An oxide diffusion mask defining the base zones of the transistors then is formed by well-known methods including oxidation and photolithography. The oxide diffusion mask defines a large array of transistor base zones inasmuch as one slice may yield several thousand transistors.

The P type base zones then are formed by a boron diffusion as indicated in Block IV. A typical method involves a predeposition and closed-box drive-in heat treatment for times and at temperatures called for by design requirements. A drive-in heat treatment at 1150 degrees centigrade for 30 minutes will produce a base zone depth of about one and one-quarter microns.

In the succeeding steps (Blocks V and VI) the oxide films are reformed to define the emitter zones for diffusion.

Then, as indicated in Block VII, a film of gold is deposited on the reverse or nonepitaxial film side of the slice. This may be done conveniently by vacuum evaporation to provide a gold layer having a thickness of about one to two thousands Angstroms.

Next, the slice is placed in a furnace for the diffusion of phosphorus for forming the emitter zones. As indicated in Block VIII, this step, carried out in a phosphorus-containing ambient, of, for example, phosphorus pentoxide ($P_2O_5$), at a temperature of 1000 degrees centigrade for about 25 minutes results also in the diffusion of gold throughout the slice and particularly the lower portion comprising the collector zones. The process effectively locates the emitter-base PN junctions at a depth of about one micron and the base-collector PN junctions at about 1.5 microns from the upper surface of the slice.

After the usual etching a further high temperature oxidation for 45 minutes at 900 degrees centigrade reforms the oxide film required for emitter protection and contact area definition.

However, this oxidation heat treatment has an undesirable effect on the gold previously diffused into the slice. In particular the relatively long heat treatment apparently causes movement of the gold atoms and an accumulation thereof, particularly in the vicinity of lattice dislocations. Thus, there is a reduction in the effective capture cross section for minority carriers and consequently an undesirable increase in minority carrier lifetime. Moreover, it should be appreciated that this deleterious movement of gold occurs even when the gold diffusion is the penultimate step of the process.

The desirable and advantageous gold distribution is restored within the slice by the heat treatment step of Block X. Typically, this is an abrupt heat treatment of not more than about 30 seconds to a relatively high temperature in the effective impurity diffusion range for silicon, of about 900 to 1300 degrees centigrade. In this particular example a rapid heat treatment at temperatures to 1150 degrees centigrade for twelve seconds is prescribed. For silicon transistors of the type described heating to 1150 to 1160 degrees centigrade for about ten to fifteen seconds is typical. Such a treatment may be carried out by a programmed insertion of the slice into a hot zone of a diffusion furnace. For example, the furnace typically, is held at a maximum temperature above that at which the heat treatment is to be accomplished. The insertion program for the semiconductor slice then determines the maximum temperature to which the slice is raised. Typically, the spiking treatment is terminated by quenching such as by an air blast. Other schemes such as brief exposure to infrared heat sources or strip heaters readily suggest themselves for such a process.

Although the phenomena is not completely understood, it is believed that the above-described abrupt heat treatment effects a movement of gold from electrically inactive precipitation centers, for example, at the epitaxial-substrate interface to desirable electrically active carrier trapping locations nearby.

Following this spike heat treatment, the slice is processed (Block XI) to form masks for contact areas, and contacts then are produced by metal deposition and relatively low temperature heat treatments. It is significant to note that these subsequent treatments at temperatures less than about 500 to 600 degrees centigrade for relatively short times of less than about ten minutes, effect substantially no movement of the gold.

In connection with the spike heating it is important to note that the duration of the treatment is too short to affect the previously diffused PN junctions although the temperature used is in the diffusion heating range of approximately 900 degrees centigrade to 1300 degrees centigrade. Also, the initial introduction of gold may occur with the base diffusion or following the final oxidation instead of with the emitter diffusion. It is significant that the quantity of gold required to sufficiently lower carrier lifetime can be introduced within reasonable times only by employing relatively high temperatures such as are encountered during the base diffusion as well as the emitter diffusion.

Therefore, in accordance with this invention, the gold for lifetime control is introduced advantageously in conjunction with regular impurity diffusions or other heat treatments, and is redistributed from precipitation or accumulation centers to concentration levels controlled by the solid solubility of gold at the spike temperature by using a "spike" heat treatment thereby avoiding a further substantial movement of the PN junctions.

Although the invention has been disclosed in terms of certain specific embodiments it will be understood that variations may be devised by those skilled in the art which likewise fall within the scope and spirit of the claims. For example, the invention may be applied likewise to a PNP transistor as well as to other semiconductor switching devices such as diodes and four-layer devices in which the controlled reduction of minority carrier lifetime is important.

We claim:

1. In the method of fabricating a silicon semiconductor switching device from a slice of silicon semiconductor material which includes solid state diffusion into said slice of significant impurities to form PN junctions and of gold to degrade minority carrier lifetime and which includes subsequent to said gold diffusion a heat treatment of more than about 900 degrees centigrade, the improvement comprising the additional step of subjecting said slice, which is at a temperature of below about 600 degrees centigrade, to an abrupt heat treatment for less than about 30 seconds at a temperature in the range of from about 900 degrees centigrade to about 1300 degrees centigrade, after which the fabrication process does not expose said slice to a temperature in excess of about 600 degrees centigrade for more than about 10 minutes.

2. The method in accordance with claim 1 in which the abrupt heat treatment is to a temperature of about 1150 degrees centigrade for a period of from about ten to fifteen seconds.

3. The process in accordance with claim 1 in which the heat treatment is done in a furnace maintained at a maximum temperature above that to which said slice is exposed.

References Cited

UNITED STATES PATENTS

| | | | |
|---|---|---|---|
| 2,964,689 | 12/1960 | Buschert | 148—186 |
| 3,067,485 | 12/1962 | Ciccolella | 148—186 |
| 3,184,347 | 5/1965 | Hoerni | 148—187 |

L. DEWAYNE RUTLEDGE, Primary Examiner

R. LESTER, Assistant Examiner

U.S. Cl. X.R.

148—1.5, 187, 188; 29—576, 578